United States Patent
Sarwinski et al.

(10) Patent No.: US 6,784,663 B2
(45) Date of Patent: Aug. 31, 2004

(54) SELF-ADJUSTING ASSEMBLY AND METHOD FOR CLOSE TOLERANCE SPACING

(75) Inventors: Ray Edmund Sarwinski, San Diego, CA (US); Richard Charles Reineman, LaJolla, CA (US); Sheldon Jao Dung Gott, San Diego, CA (US); David Alan Schurig, LaJolla, CA (US); Douglas Norman Paulson, Del Mar, CA (US)

(73) Assignee: Tristan Technologies, Inc., San Diego, CA (US)

( * ) Notice: Subject to any disclaimer, the term of this patent is extended or adjusted under 35 U.S.C. 154(b) by 0 days.

(21) Appl. No.: 10/228,694

(22) Filed: Aug. 26, 2002

(65) Prior Publication Data

US 2003/0042898 A1 Mar. 6, 2003

Related U.S. Application Data

(60) Provisional application No. 60/315,296, filed on Aug. 27, 2001.

(51) Int. Cl.$^7$ .......................... G01R 33/035; F17C 3/08; F17C 13/08
(52) U.S. Cl. ................. 324/248; 200/560.06; 600/409; 248/901
(58) Field of Search ................................ 248/550, 901, 248/309.1; 324/248, 224, 261, 262, 207, 12; 165/81; 327/582; 505/846; 600/409; 62/45.1, 51.1; 320/560.06

(56) References Cited

U.S. PATENT DOCUMENTS 3,976,938 A    8/1976   Hesterman ................. 324/248
4,115,194 A *  9/1978   Butti ......................... 376/461
4,349,781 A *  9/1982   Vozoff ....................... 324/346
4,437,064 A    3/1984   Overton, Jr. et al. ....... 324/346
4,496,073 A *  1/1985   Silver et al. ........... 220/560.11
4,927,599 A *  5/1990   Allen ......................... 376/321
5,385,026 A *  1/1995   Zhang et al. .............. 62/50.7
5,880,588 A    3/1999   Kado ......................... 324/248
5,894,220 A    4/1999   Wellstood et al. .......... 324/248
6,023,633 A    2/2000   Kado ......................... 600/409
6,457,958 B1  10/2002   Dunn .......................... 418/1

FOREIGN PATENT DOCUMENTS

JP    55090798 A  *  7/1980   ............. F17C/3/04

OTHER PUBLICATIONS

Fleet, E.F., "Closed–cycle refrigerator–cooled scanning SQUID microscope for room–temperature samples," Review of Scientific Instruments, vol. 72, No. 8, pp. 3281–3290, Aug. 2001.

* cited by examiner

*Primary Examiner*—N. Le
*Assistant Examiner*—Darrell Kinder
(74) *Attorney, Agent, or Firm*—Duckor Spradling & Metzger; Bernard L. Kleinke

(57) ABSTRACT

A self-adjusting assembly and method are disclosed. In the disclosed embodiments, a support assembly for supporting a device comprises a pair of support members for supporting the device. One of the members is adapted to help support the device from a ground, and another of the members is adapted to provide lateral support for the device and to permit free longitudinal movement of the device as it expands or contracts due to temperature variations.

25 Claims, 2 Drawing Sheets

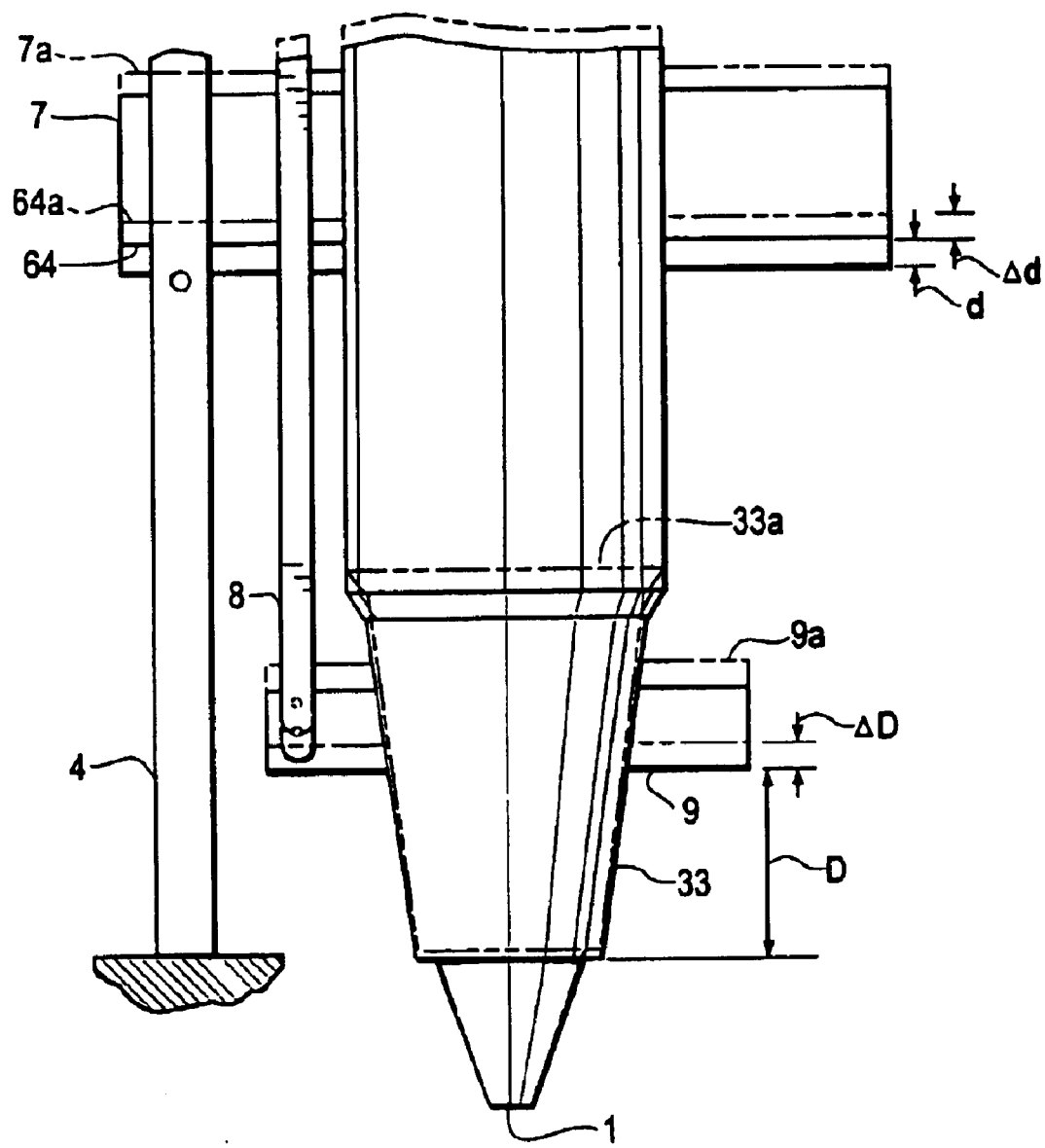

SELF-ADJUSTING ASSEMBLY AND METHOD FOR CLOSE TOLERANCE SPACING

RELATED APPLICATIONS

This application is related to, and claims priority under 35 U.S.C. § 119(e) of, U.S. provisional application Serial No. 60/315,296, titled "SELF-ADJUSTING SQUID PROBE ASSEMBLY FOR CLOSE TOLERANCE SQUID-TO-SAMPLE SPACING", filed Aug. 27, 2001, which is hereby incorporated by reference in its entirety.

BACKGROUND OF THE INVENTION

1. Field of the Invention

The invention relates generally to a self-adjusting assembly and method for close-tolerance spacing, and it more particularly relates to a SQUID probe microscope assembly and method for measurements of room-temperature samples for close tolerance squid-to-sample spacing.

2. Related Art

The information contained in this section relates to the background of the art of the present invention without any admission as to whether or not it legally constitutes prior art.

Microscope assemblies employing a scanning superconducting quantum interference device (SQUID) probe have been employed in the past for measurements of room-temperature samples. For example, reference may be made to an article entitled "CLOSED-CYCLE REFRIGERATOR-COOLED SCANNING SQUID MICROSCOPE FOR ROOM-TEMPERATURE SAMPLES" by E. F. Fleet, et al, published in *American Institute of Physics* (Aug., 2001), which is incorporated herein by reference. This was achieved by employing the SQUID in an evacuated dewar having a window position therein. In this regard, the sample under test was positioned in close proximity on the room-temperature side of the window, and the SQUID probe tip was positioned inside the dewar in close proximity to the cold side of the window so that the probe tip would be disposed in a close tolerance spacing relative to the sample under test.

However, when the SQUID probe was deactivated, for example, such as when not in use, the SQUID probe expands axially as a result of thermal expansion due to the warming of the SQUID. Due to the close spacing with the window, the expanding probe tip could contact and break through the thin membrane window. Such a situation would be highly undesirable and destructive, because the window is expensive to replace, and the loss of vacuum within the dewar could cause extensive damage to the expensive SQUID.

In an attempt to overcome this problem, others have provided a mechanism for moving the window to the SQUID tip during operation of the SQUID microscope as explained in the aforementioned article. Thus, after the measurement is taken, the window is moved away from the probe tip.

In this manner, during the deactivation and warming of the SQUID probe assembly, the thermally expanding probe tip would not tend to engage the window, thereby causing damage to the unit.

However, the window must be moved into its adjusted position relative to the probe tip each time a measurement is to be taken. Such an operation is necessarily time-consuming, and does not always result in precisely the same spacing each time the adjustment is made. Thus, the measurements may not always be consistent. The adjustment of backing the window away from the probe tip must be accomplished at the end of each use of the SQUID probe assembly and at the end of each day of operation. Thereafter, it must be readjusted, in some instances, in three axes.

Due to differential temperature shrink rates in various components, conventional SQUID/pickup coil arrangements are placed in close proximity to room-temperature samples by adjusting the "tail" or tip of the dewar with, for example, a bellows or sliding mechanism of the "window," as explained in the foregoing article. Alternatively, the SQUID probe itself could be re-positioned. Thus, the serious nature of the problem due to the cryogenic temperature induced shrinkage in the cold super-conductive components relative to the vacuum housing, which must remain at room temperature during operation when room temperature samples are to be measured.

BRIEF DESCRIPTION OF THE DRAWINGS

In the following, the invention will be explained in further detail with reference to the drawings, in which:

FIG. 2 is a diagrammatic, partially broken away view of the SQUID probe assembly of FIG. 1 illustrating in broken lines the configuration of the assembly in its expanded position.

DESCRIPTION OF CERTAIN EMBODIMENTS OF THE INVENTION

Figure 1:
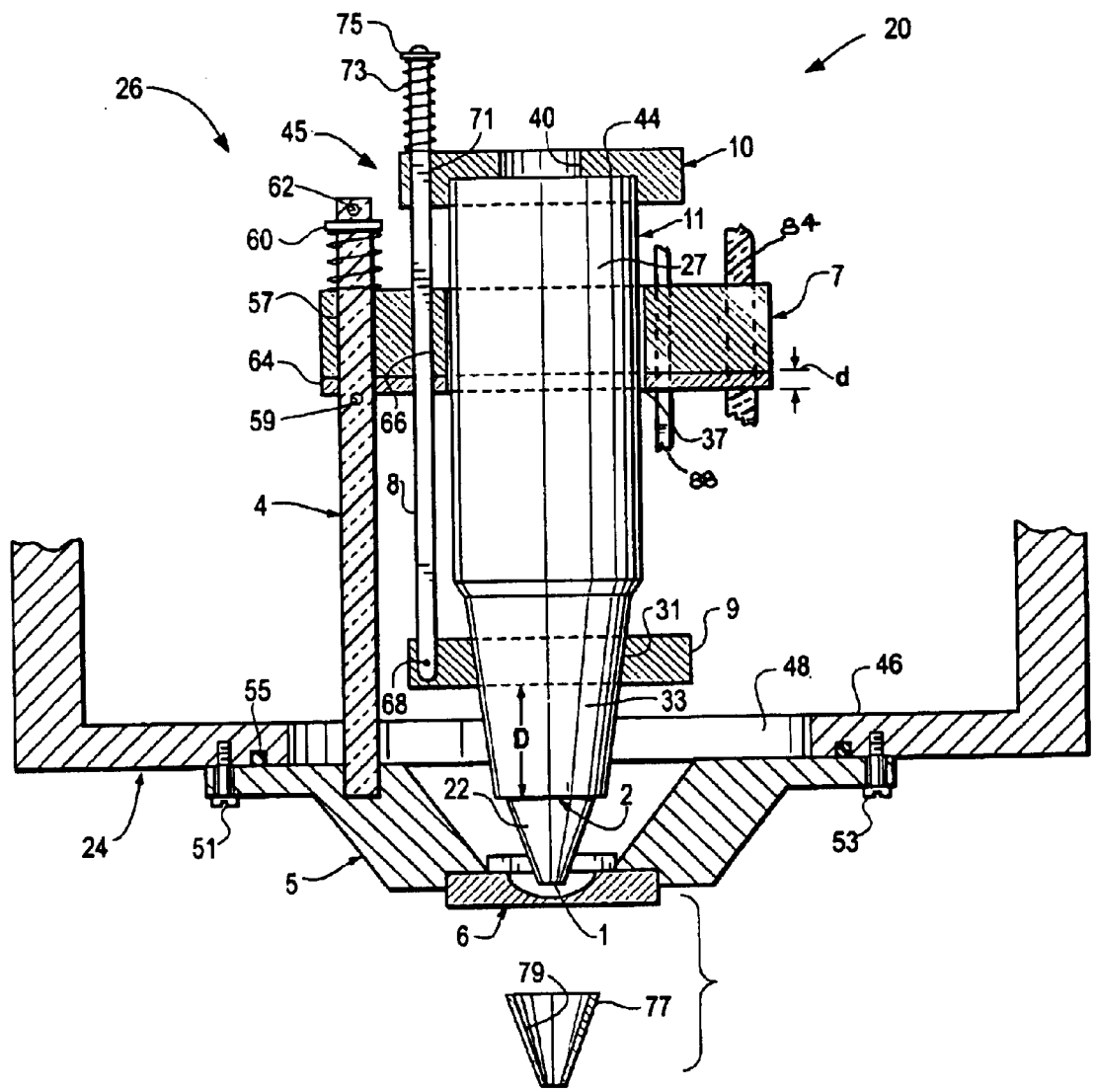
FIG. 1 is a diagrammatic, partially broken away view of one example of a SQUID probe assembly constructed according to one embodiment of the invention.

According to one embodiment, a support assembly for supporting a device comprises a pair of support members for supporting the device. One of the members is adapted to help support the device from a ground, and another of the members is adapted to provide lateral support for the device and to permit free longitudinal movement of the device as it expands or contracts due to temperature variations.

According to another embodiment, a support assembly for supporting a device comprises a set of grounded rods. The rods are circumferentially spaced apart around the device and are substantially parallel to the device. The assembly includes a support bracket adapted to move along the grounded rods and is adapted to carry the device along as the support bracket moves along the grounded rods. The assembly includes an expandable member adapted to expand along a direction parallel to the device with increasing temperature. The expandable member is further adapted to cause the support bracket to move along the grounded rods as the member expands.

According to yet another embodiment of the invention, a support assembly for supporting a device comprises a set of grounded rods. The rods are circumferentially spaced apart around the device and are substantially parallel to the device. An expandable member is adapted to expand along a direction parallel to the device with increasing temperature. The assembly includes means for transferring the expansion of the expandable member to corresponding movement of the device in the parallel direction.

According to still another embodiment of the invention, a method of supporting a device comprises supporting the device from a ground, laterally supporting the device, and permitting free longitudinal movement of the device According to yet another embodiment of the invention, a method of supporting a device comprises supporting the device with a support bracket adapted to move along a set of grounded rods and adapted to carry the device along as the support bracket moves along the grounded rods. The rods are circumferentially spaced apart around the device and are substantially parallel to the device. The method includes laterally supporting the device, and causing the support bracket to move along the rods via an expandable member. The expandable member is adapted to expand along a direction parallel to the device with increasing temperature.

In the SQUID probe assembly disclosed herein, the thermal contraction problems are balanced against the thermal isolation and conductive contact by using an assembly of materials such that the "warm" position is the same or further away than the "cold" position within pull-away specifications. In the preferred embodiment disclosed herein, the assembly of the SQUID and structure is on the inside of a dewar wall—in the vacuum space. It is connected with a thermal link that has a conductance of at least 0.08W/K if at 77K. The assembly is designed for operation at 77K and 4K operation.

Referring now to the drawings, and particularly to FIG. 1 thereof, there is shown a self-adjusting SQUID probe assembly 20, which is used for close tolerance SQUID-to-sample spacing. The SQUID probe assembly 20 includes a SQUID 11 oriented in a generally vertical disposition and having a tip 22 at the bottom-most portion thereof. A sensor 1 is disposed at the bottom-most portion of the tip 22 adjacent to a window 6 of a dewar 24. In a preferred embodiment, the window 6 is composed of sapphire material.

A mounting assembly or thermal link generally indicated at 26 positions the sensor 1 of the tip in very close tolerance spacing relative to the window 6 at the inside of the dewar 24.

In the disclosed embodiment, the mounting assembly 26 includes a set of three horizontally-disposed, annular brackets or supports 7, 9 and 10 for supporting the SQUID 11 in its generally vertical disposition. The annular central bracket 7 surrounds the central body portion 27 of the elongated SQUID 11. The lower bracket 9 is provided with a tapered central aperture 31 for receiving a nose portion 33, which is tapered and extends between the tip portion 22 and the central body portion 35. At operating temperature, such as 4K, the bottom surface of the lower bracket 9 is located at a distance D from the bottom 2 of the nose portion 33. The central bracket 7 includes a central aperture 37 for receiving the body portion 27 of the SQUID 11. The upper bracket 10 includes a central aperture 40 through which extend cables (not shown) for the SQUID extending to a liquid nitrogen tank or other cold source (not shown). A shoulder portion 44 of the aperture receives the top end portion of the SQUID 11. The mounting brackets 7, 9 and 10 are preferably composed of suitable materials such as sapphire, which has a low coefficient of thermal expansion, good electrical insulation properties, and good thermal conductivity.

It will be understood by those skilled in the art that, although the illustrated embodiment discloses annular brackets for support, other configurations may be used as well. For example, the supports may be spaced-apart point supports on the side of the SQUID 11.

The mounting assembly 26 includes two set of support rods, an inner set and an outer set, generally indicated at 45. Each set of rods may include a plurality of rods spaced circumferentially around the SQUID 11. In one embodiment, each set of rods includes three rods spaced 120 degrees apart. In other embodiments, the number of rods in the first set may be different from the number of rods in the second set. For illustration purposes, only rod 4, 8 and 84, 88 are illustrated in FIG. 1. The sets of rods are radially spaced apart about the periphery of the SQUID 11.

The upstanding outer rod 4 supports the mounting bracket 7 in a parallel spaced apart relationship relative to a centrally apertured bottom wall 46 of the dewar 24. In this regard, the bottom end portion of the rod 4 extends through an aperture 48 in the bottom wall 46 of the dewar 24 and is affixed within a nose-piece 5 bolted onto the underside of the bottom wall 46 by a pair of suitable fastening devices, such as a pair of screws 51 and 53, the nose-piece 5 being sealed to the bottom wall 46 by means of an O-ring 55. In this regard, the outer rod 4 is stably grounded. The outer rod 4 is preferably composed of a quartz material which has a very low coefficient of thermal expansion and is a good heat insulator.

The central mounting bracket 7 is provided with a set of outer apertures, such as aperture 57, for receiving the upper end portion of the outer rod 4. The aperture 57 is large enough to allow the outer rod 4 to slide vertically therein. The central mounting bracket 7 rests on a set of pins such as pin 59 affixed to the rod 4. In one embodiment, the central mounting bracket 7 is biased downward against the pin 59 by a spring 60 positioned between the upper surface of the central mounting bracket 7 and a pin 62. The central mounting bracket 7 may also be provided with a set of inner apertures, such as through hole 66, for allowing the inner rods, such as rod 8, to fit therethrough.

The inner rod 8 is composed of suitable material such as sapphire so that it has a very low coefficient of thermal expansion. The inner rod 8 extends through the through hole 66 in the central mounting bracket 7 and is affixed to the central mounting bracket 7 by, for example, a suitable adhesive such as GE varnish. Thus, while the central bracket 7 allows relative vertical movement of the outer rod 4, the inner rod 7 is firmly affixed to the central mounting bracket 7.

The lower end of the inner rod 8 is attached to the lower mounting bracket 9 by, for example, means of a pin 68. An aperture 71 in the upper mounting bracket 10 loosely receives the upper end portion of the inner rod 8. The upper mounting bracket 10 is biased downward by a spring 73 surrounding the upper end portion of the inner rod 8. The spring 73 is compressed between the upper surface of the upper mounting bracket 10 and a pin 75 in the inner rod 8.

The central mounting bracket 7 includes an annular shim 64 at the undersurface of the central mounting bracket 7 resting on the pin 59 of the outer rod 4. The aperture 66 in the central mounting bracket 7 extends through the shim 64, thereby allowing the inner rod 8 to pass therethrough. The shim 64 is composed of suitable material, such as Nylon, which has a coefficient of thermal expansion sufficient to enable the shim 64 to expand when the SQUID 11 warms from a cold operating temperature, such as 4K, toward room temperature. At the cold operating temperature, the shim 64 has a thickness d that may be selected to compensate for the expansion of the SQUID 11, as described below in further detail. While the central mounting bracket 7 is affixed to the inner rod 8 passing through the through hole 66, the shim is preferably not affixed to the rod 8. Thus, vertical expansion of the shim 64 causes the central mounting bracket to move upward, thereby carrying the central mounting bracket 7 upward as well.

A spacer 77 may be used during factory installation of the assembly 20. In one embodiment, the spacer 77 is generally frusto-conical in shape and has a tapered interior opening 79 for receiving the SQUID tip 33. In this regard, in order to assemble the SQUID 11 in position, the window 6 may be removed and the spacer 77 may be placed over the SQUID tip and supported in place (by means not shown) to adjust the close tolerant spacing of the probe tip sensor 1.

In the disclosed embodiment, a selected shim 64 of a selected thickness d at a cold operating temperature is mounted in place on the underside of the central mounting bracket 7. The system 20 may be tested for thermal balancing between the shim 64 and the expansion characteristics of the probe nose portion 33. In this regard, various thicknesses of the shim 64 may be tested in order to balance the system so that when the SQUID 11 warms from the cold operating temperature to room temperature, the expansion of the SQUID nose portion 33 at distance D will be equal to or less than the thermal expansion of the shim along its thickness d. Thus, contact between the SQUID tip 1 and the window 6 may be definitively prevented. Additionally, once the SQUID 11 is cooled to operating temperature, the SQUID nose portion 33 shrinks back to its original position D, and the shim 64 shrinks to return to its operational thickness d so that close tolerance spacing between the SQUID probe 1 and the window 6 may be maintained during the cooling and warming cycles of the system.

This aspect of the system 20 is further illustrated with reference to FIG. 2, in which the lower portion of the SQUID assembly is shown in greater detail with certain components removed for clarity. At a cold operating temperature, such as 4K, the configuration of the assembly is illustrated with solid lines, while the configuration at room temperature is shown in dotted lines. At the cold operating temperature, the nose portion 33 extends to a distance D from the bottom surface of the lower mounting bracket 9, and the shim 64 has a thickness d. As the system 20 warms from operating temperature to room temperature, the SQUID body, including the nose portion 33 expands in the vertical direction. FIG. 2 indicates the expanded nose portion as reference numeral 33a. As noted above, the shim 64 is selected to also expand. As illustrated in FIG. 2, the expansion of the shim 64 (indicated by reference numeral 64a in its expanded position) is indicated by $\Delta d$, and the expansion of the nose portion 33a is indicated by $\Delta D$. As the shim 64 expands, the central mounting bracket 7 is pressed higher by the expanding shim 64. The central mounting bracket 7 slides vertically along the outer post 4 to a new position (indicated by reference numeral 7a in FIG. 2) and carries with it the inner post 8. As the inner post 8 is lifted by the central mounting bracket 7, the inner post 8 lifts the lower mounting bracket 9 by a distance of $\Delta d$ to a new position (indicated by reference numeral 9a in FIG. 2), thereby lifting the nose portion 33 of the SQUID. Accordingly, the proper selection of the shim 64 may result in exact or approximate compensation for the expansion of the nose portion 33 to prevent downward expansion of the nose portion 33. The shim 64 may be selected such that $\Delta d$ is greater than $\Delta D$, thereby increasing the distance between the sensor 1 and the window 6. When the system is again cooled to operating temperature, the springs 60, 73 (FIG. 1) cause the system to resume its original configuration.

It is noted that, conceptually, the length D represents the distance from a lower point to an upper point at which the SQUID is vertically supported. The expansion of the shim 64 causes the vertical support point to be moved upward by $\Delta d$. Accordingly, the expansion $\Delta d$ of the shim 64 should be selected to accommodate the expansion of the appropriate section of the SQUID.

It is further noted that, in other embodiments, the central bracket 7 and the lower bracket 9 may be combined into a single bracket. For example, the a single bracket may be provided with a shim and may be secured to the SQUID. Accordingly, the expansion of the shim causes the single bracket to rise upward, carrying the SQUID upward as well.

In one embodiment, the system 20 is calibrated using fiberglass composite components instead of Quartz or Sapphire. The total shrink-away of the assembly upon cooling to 77 Kelvin (liquid nitrogen temperature is required to operate the high temperature SQUID device HTS) has been experimentally measured to be 0.0025 inches or 64 micrometers. The quartz/sapphire assembly was then tested by cooling in the same manner and found to shrink away only 0.0002 inches or 5.1 micrometers. This greater than a factor of ten reduction demonstrates the ability to set the device up warm and then cool down to Liquid Nitrogen temperature. Further improvements are made by adding a shim of brass below the spring-loaded support points of the large sapphire disc or ring so that it will shrink away in the opposite direction to the quartz. By adjusting this thickness to be around 0.1 inch (250 microns) it can be made to exactly compensate for the 5.1 microns of net shrink away of the quartz/sapphire assembly.

The low thermal contraction coefficient and thermal conductivity of quartz rotates the sapphire disc from room temperature and the high thermal conductivity and low thermal contraction of sapphire allows good thermal contact and no further appreciable motion upon cool down of the HTS sensor probe.

This method allows unprecedented ability to adjust the sensor 1 nestled in the quartz/sapphire assembly to within a few microns of the warm surface. By using a few layers of superinsulation and a very thin sapphire "window," the room temperature sample to HTS sensor probe can be safely set to less than 100 microns. This gives the possibility of placing the HTS pickup coil close enough to the sample to achieve less than 100 micron resolution. All of the preparations are done only once at the "factory" and each additional usage or thermal cycling of the instrument require no further adjustment.

This technique may also be employed at 4K.

One example of an actual system which was built and tested yielded the data shown in the below listed Tables 1, 2 and 3.

TABLE 1

Replacing Quartz and Sapphire with G-10 supports and using dummy probe (Room Temperature vs. liquid nitrogen)

| Time | Temperature | Laser Gauge (micron) | Dial indicator (inch) |
| --- | --- | --- | --- |
| 11:30 | RT | .000 | .0000 |
| 11:56 | LN2 | .025 | .0025 |

TABLE 2

Quartz and Sapphire supports using dummy probe (Room temperature vs. liquid nitrogen)

| Time | Temperature | Laser Gauge (micron) | Dial indicator (inch) |
| --- | --- | --- | --- |
| 20:51 | RT | .000 | .000 |
| 20:57 | LN2 | .056 | .0002 |

TABLE 3

Properties of materials @ R.T. vs. 77 K

| Material | Thermal Conductivity (W/cmK) | | Coefficient of Thermal expansion (W/cmC) | Coefficient of Thermal expansion (W/cmC) | Integral coefficient of thermal expansion |
|---|---|---|---|---|---|
| | @ 300 K | @ 77 K | @ 300 K | @ 77 K | (W/cm) |
| Quartz | 0.01 | 0.004 | 5.50E−07 | −7.00E−07 | 1.44928E−05 |
| Sapphire | 2 | 50 | 5.38462E−06 | 1.5E−06 | 0.000788644 |
| Macor | 0.0146 | | 9.40E−06 | 0.00001 | 0.002 |
| Copper | 2 | 1.2 | 1.60E−05 | 9.00E−06 | 3.30E−03 |
| G-10 perp. | 0.005 | 0.003 | 0.000025 | 0.000017 | 3.00E−03 |
| G-10 parallel | 0.005 | 0.003 | −0.000003 | 0.000006 | 2.303−03 |
| Brass | 0.8 | 0.4 | 1.90E−05 | 1.05E−05 | 3.80E−03 |

While particular embodiments of the present invention have been disclosed, it is to be understood that various different modifications and combinations are possible and are contemplated within the true spirit and scope of the appended claims. There is no intention, therefore, of limitations to the exact abstract and disclosure herein presented.

What is claimed is:

1. A support assembly for supporting a device, comprising:
    a set of grounded rods, said rods being circumferentially spaced apart around said device and being substantially parallel to said device;
    a support bracket adapted to move along said grounded rods and adapted to carry said device along as, said support bracket moves along said grounded rods; and
    an expandable member adapted to expand along a direction parallel to said device with increasing temperature, said expandable member being further adapted to cause said support bracket to move along said grounded rods as said member expands.

2. The support assembly according to claim 1, wherein said support bracket is an annular ring having a central aperture for accommodating said device.

3. The support assembly according to claim 1, wherein said support bracket is composed of sapphire.

4. The support assembly according to claim 1, wherein said grounded rods are composed of quartz.

5. The support assembly according to claim 1, wherein said expandable member is composed of nylon.

6. The support assembly according to claim 1, wherein said device is a vertically oriented SQUID.

7. The support assembly according to claim 1, wherein said device is supported at a support point, said support point being a distance D from one end of said device, said device being further adapted to expand with increasing temperature in said parallel direction by a distance $\Delta D$ between said one end and said support point,
    wherein said expendable member has a thickness d in said parallel direction and is adapted to expand with increasing temperature by $\Delta D$ in said parallel direction, and
    wherein $\Delta d$ is equal to or greater than $\Delta D$.

8. The support assembly according to claim 1, further comprising:
    a second set of rods affixed to said support bracket, said second set of rods being circumferentially spaced apart around said device and being substantially parallel to said device; and
    a second support bracket affixed to said second set of rods and adapted to engage said device for movement along said parallel direction.

9. The support assembly according to claim 1, wherein said support bracket is adapted to carry said device indirectly via a second set of rods and a second support bracket.

10. The support assembly according to claim 1, wherein said expandable member is a shim, and said shim is mounted on one side of said support bracket.

11. The support assembly according to claim 10, wherein one side of said shim is immovably engaged to said grounded rods.

12. A support assembly for supporting a device, comprising:
    a set of grounded rods, said rods being circumferentially spaced apart around said device end being substantially parallel to said device;
    an expandable member adapted to expand along a direction parallel to said device with increasing temperature; and
    means for transferring said expansion of said expandable member to corresponding movement of said device in said parallel direction.

13. The method assembly according to claim 12, wherein said device is a vertically oriented SQUID.

14. A method of supporting a device, comprising:
    supporting said device with a support bracket adapted to move along a set of grounded rods and adapted to carry said device along as said support bracket moves along said grounded rods, said rods being circumferentially spaced apart around said device and being substantially parallel to said device;
    laterally supporting said device; and
    causing said support bracket to move along said rods via an expandable member, said expandable member being adapted to expand along a direction parallel to said device with increasing temperature.

15. The support assembly according to claim 14, wherein said support bracket is an annular ring having a central aperture for accommodating said device.

16. The support assembly according to claim 14, wherein said support bracket is composed of sapphire.

17. The support assembly according to claim 14, wherein said grounded rods are composed of quartz.

18. The support assembly according to claim 14, wherein said expandable member is composed of nylon.

19. The support assembly according to claim 14, wherein said device is a vertically oriented SQUID.

20. The support assembly according to claim 14, wherein said device is supported at a support point, said support point being a distance D from one end of said device, said device being further adapted to expand with increasing temperature in said parallel direction by a distance AD between said one end and said support point, wherein said expandable member has a thickness c in said, parallel direction and is adapted to expand with increasing temperature by Ad in said parallel direction, and wherein Δd is equal to or greater than AD.

21. The support assembly according to claim 14, further comprising:

a second set of rode affixed to said support bracket, said second set of rods being circumferentially spaced apart around said device and being substantially parallel to said device; and a second support bracket affixed to said second set of rods and adapted to engage said device for movement along said parallel direction.

22. The support assembly according to claim 14, wherein said support bracket is adapted to carry said device indirectly via a second set of rods and a second support bracket.

23. The support assembly according to claim 14, wherein said expandable member is a shim, and said shim is mounted on one side of amid support bracket.

24. The support assembly according to claim 23, wherein one side of said shim is immovably engaged to said grounded rods.

25. A support assembly for supporting a device, comprising:

a pair of support members for supporting said device;

one of said members being adapted to help support said device from a ground;

another of said members being adapted to provide lateral support for said device and to permit free longitudinal movement of the device as it expands or contracts due to temperature variations; and wherein said device is a vertically oriented SQUID.

* * * * *

UNITED STATES PATENT AND TRADEMARK OFFICE
CERTIFICATE OF CORRECTION

PATENT NO. : 6,784,663 B2
DATED : August 31, 2004
INVENTOR(S) : Ray Edmund Sarwinski et al.

It is certified that error appears in the above-identified patent and that said Letters Patent is hereby corrected as shown below:

Column 7,
Line 31, delete "rods and adapted to carry said device along as, said" and insert
-- rods and adapted to carry said device along as said --

Column 8,
Line 31, delete "spaced apart around said device end being substantially" and insert
-- spaced apart around said device and being substantially --

Column 9,
Line 2, delete "said parallel direction by a distance AD between said one" and insert
-- said parallel direction by a distance $\Delta$D between said one --
Line 6, delete "increasing temperature by Ad in said parallel direction," and insert
-- increasing temperature by $\Delta$d in said parallel direction, --
Line 8, delete "wherein Ad is equal to or greater than AD." and insert
-- wherein $\Delta$d is equal to or greater than $\Delta$D. --
Line 11, delete "a second set of rode affixed to said support bracket, said" and insert
-- a second set of rods affixed to said support bracket, said --

Column 10,
Line 3, delete "on one side of amid support bracket." and insert
-- on one side of said support bracket. --

Signed and Sealed this

Ninth Day of August, 2005

JON W. DUDAS
*Director of the United States Patent and Trademark Office*